US012601780B2

(12) United States Patent
Enjeti et al.

(10) Patent No.: US 12,601,780 B2
(45) Date of Patent: Apr. 14, 2026

(54) METHODS AND SYSTEMS FOR DETECTING COMPROMISED SENSORS USING DYNAMIC WATERMARKING

(71) Applicant: The Texas A&M University System, College Station, TX (US)

(72) Inventors: Prasad N. Enjeti, College Station, TX (US); Le Xie, College Station, TX (US); Panganamala R. Kumar, College Station, TX (US)

(73) Assignee: THE TEXAS A&M UNIVERSITY SYSTEM, Bryan, TX (US)

( * ) Notice: Subject to any disclaimer, the term of this patent is extended or adjusted under 35 U.S.C. 154(b) by 212 days.

(21) Appl. No.: 18/209,835

(22) Filed: Jun. 14, 2023

(65) Prior Publication Data

US 2023/0400504 A1     Dec. 14, 2023

Related U.S. Application Data

(60) Provisional application No. 63/352,131, filed on Jun. 14, 2022.

(51) Int. Cl.
    *G01R 31/28*          (2006.01)
(52) U.S. Cl.
    CPC ................................ *G01R 31/2829* (2013.01)
(58) Field of Classification Search
    CPC ........ G01R 31/2829; G01R 1/00; G01R 3/00;
             G01R 5/00; G01R 7/00; G01R 9/00;
             G01R 11/00; G01R 13/00; G01R 15/00;
             G01R 17/00; G01R 19/00; G01R 21/00;
             G01R 22/00; G01R 23/00; G01R 25/00;
             G01R 27/00; G01R 29/00; G01R 31/00;
             G01R 33/00; G01R 35/00
    See application file for complete search history.

(56) References Cited

U.S. PATENT DOCUMENTS

2019/0006847 A1*  1/2019  Venkatasubramanian ..................
                                              H02J 13/00002
2020/0106785 A1*  4/2020  Abbaszadeh ....... H04L 63/1425
2020/0409323 A1*  12/2020  Spalt ...................... G06F 17/18

OTHER PUBLICATIONS

Jaewon Kim, Woo-Hyun Ko and P. R. Kumar, "Cyber-security with dynamic watermarking for process control systems," in 2019 AIChE Annual Meeting. AIChE, 2019.
A. K. Abdelsalam, A. M. Massoud, S. Ahmed and P. N. Enjeti, "High-Performance Adaptive Perturb and Observe MPPT Technique for Photovoltaic-Based Microgrids," in IEEE Transactions on Power Electronics, vol. 26, No. 4, pp. 1010-1021.

(Continued)

*Primary Examiner* — Judy Nguyen
*Assistant Examiner* — Brent J Andrews
(74) *Attorney, Agent, or Firm* — Jenkins, Taylor & Hunt, P.A.

(57)          ABSTRACT

Systems and methods for detecting compromised sensors using dynamic watermarking. In some examples, a method includes injecting a dynamic random signal into an input of a power distribution system. The power distribution system includes at least one sensor and at least one power electronic controller configured to use the at least one sensor. The method includes monitoring a sensor signal from the at least one sensor. The method includes determining whether the at least one sensor is compromised based on a comparison between the dynamic random signal and the sensor signal.

20 Claims, 10 Drawing Sheets

(56) References Cited

OTHER PUBLICATIONS

A. Teymouri. A. Mehrizi-Sani and C. Liu, "Cyber Security Risk Assess-ment of Solar PV Units with Reactive Power Capability," IECON 2018 44th Annual Conference of the IEEE Industrial Electronics Society, Washington, DC. 2018 pp. 2872-2877.

A. S Spanias, "Solar energy management as an Internet of Things (IoT) application," 2017 8th International Conference on Information, Intelligence, Systems & Applications (IISA), Lamaca, 2017, pp. 1-4.

I. Akkaya, E. A. Lee and P. Derier, "Model-based evaluation of GPS spoofing attacks on power grid sensors," 2013 Workshop on Modeling and Simulation of Cyber-Physical Energy Systems (MSCPES), Berkeley, CA, 2013, pp. 1-6.

G. Tertytchny et al., "Demonstration of Man in the Middle Attack on a Commercial Photovoltaic Inverter Providing Ancillary Services," 2020 IEEE CyberPELS (CyberPELS), Miami, FL, USA, 2020, pp. 1-7.

Barua, A. (2020). Hall Spooyng. A Non-invasive DOS Attack on Grid-Tied Solar Inverter. UC Irvine. Retrieved from https://escholarship.org/uc/item/0371446g.

Kim, et al, "Security of Control Systems with Erroneous Observations", Science Direct, IFAC PapersOnLine, pp. 1-6 (2020).

Ramos-Ruiz, et al., "An Active Detection Scheme for Cyber Attacks on Grid-tied PV Systems", IEEE, Department of Electrical & Computer Engineering, pp. 1-6 (2020).

Ko, et al, "Dynamic Watermarking-based Defense of Transportation Cyber-physical Systems", ACM Trans. Cyber-Phys. Syst. 4, 1, Article 12, pp. 1-21 (Nov. 2019).

Huang, et al., "An Online Detection Framework for Cyber Attacks on Automatic Generation Control", IEEE Transactions on Power Systems, vol. 33, No. 6. pp. 1-12 (Nov. 2018).

Satchidanandan, et al., "Dynamic Watermarking: Active Defense of Networked Cyber-Physical Systems", Proceedings of the IEEE, vol. 105, No. 2, pp. 1-22 (2017).

Satchidanandan, et al., "On Minimal Tests of Sensor Veracity for Dynamic Watermarking-Based Defense of Cyber-Physical Systems". 2017 9th International Conference on Communication Systems and Networks (COMSNETS), pp. 1-8 (2017).

Ko, et al, "Theory and Implementation of Dynamic Watermarking for Cybersecurity of Advanced Transportation Systems", 2016 IEEE Conference on Communications and Network Security (CNS): International Workshop on Cyber-Physical Systems Security (CPS-Sec), pp. 1-5 (2016).

Salchidanandan, et al., "Secure Control of Networked Cyber-Physical Systems", 2016 IEEE 55th Conference on Decision and Control (CDC), pp. 1-7 (Dec. 2016).

J. Ramos-Ruiz et al., "Validation of a Robust Cyber Shield for a Grid Connected PV Inverter System via Digital Watermarking Principle," 2021 IEEE 12th International Symposium on Power Electronics for Distributed Generation Systems (PEDG) 2021. pp. 1-6. doi:10.1109/PEDG51384.2021.9494227.

D. Kushner, "The real story of stuxnet," in IEEE Spectrum, vol. 50, No. 3, pp. 48-53, Mar. 2013, doi: 10.1109/MSPEC.2013.6471059.

M. Liserre, T. Sauter and J. Y. Hung, "Future Energy Systems: Integrating Renewable Energy Sources into the Smart Power Grid Through Industrial Electronics," in IEEE Industrial Electronics Magazine, vol. 4, No. 1, pp. 18-37, Mar. 2010, doi:10.1109/MIE.2010.935861.

T. Nguyen, S. Wang, M. Alhazmi, M. Nazemi, A. Estebsari, and P. Dehghanian, "Electric Power Grid Resilience to Cyber Adversaries: State of the Art," IEEE Access, vol. 8, pp. 87592-87608, 2020, doi: 10.1109/ ACCESS.2020.2993233, IEEE Access.

Satchidanandan, Bharadwaj, and P. R. Kumar. "On the design of security-guaranteeing dynamic watermarks." IEEE Control Systems Letters 4.2 (2019): 307-312.

Kumar, P. R., et al. "M1901097—Information Sciences Campaign, KCIIS-1: Cyber Fire and Maneuver in Tactical Battle: Dynamic Watermarking and Timing Analysis to Protect Vehicular Cyber-Physical Systems." (2019).

Weerakkody, Sean, Yilin Mo, and Bruno Sinopoli. "Detecting integrity attacks on control systems using robust physical watermarking." 53rd IEEE Conference on Decision and Control. IEEE, 2014.

Mo, Yilin, Rohan Chabukswar, and Bruno Sinopoli. "Detecting integrity attacks on SCADA systems." IEEE Transactions on Control Systems Technology 22.4 (2013): 1396-1407.

Mo, Yilin, and Bruno Sinopoli. "Secure control against replay attacks." 2009 47th Annual Allerton Conference on Communication, Control, and Computing (Allerton). IEEE, 2009.

Farwell, James P., and Rafal Rohozinski. "Stuxnet and the future of cyber war." Survival 53.1 (2011): 23-40.

B. Satchidanandan and P. R. Kumar, "On minimal tests of sensor veracity for dynamic watermarking-based defense of cyber-physical systems," in Proc. 9th Int. Conf. Commun. Syst. Nefw. (COMSNETS), 2017, pp. 23-30 doi: 10.1109/COMSNETS. 2017.7945354.

T. Huang, B. Wang, J. Ramos-Ruiz, P. Enjeti, P. R. Kumar and L. Xie, "Detection of cyber attacks in renewable-rich microgrids using dynamic watermarking," in Proc. IEEE Power Energy Soc. General Meeting (PESGM), Montreal. 2020, pp. 1-5. doi:10.1109/PESGM41954.2020.9282071.

Hosseinzadehtaher, et al., "Anomaly Detection in Distribution Power System based on a Condition Monitoring Vector and Ultra-Short Demand Forecasting", IEEE, pp. 1-6 (2020).

V. Vorperian, "Simplified analysis of PWM converters using model of PWM switch. Continuous conduction mode," in IEEE Transactions on Aerospace and Electronic Systems, vol. 26, No. 3, pp. 490-496, May 1990.

* cited by examiner

METHODS AND SYSTEMS FOR DETECTING COMPROMISED SENSORS USING DYNAMIC WATERMARKING

PRIORITY CLAIM

This application claims the benefit of U.S. Provisional Patent Application Ser. No. 63/352,131, filed Jun. 14, 2022, the disclosure of which is incorporated herein by reference in its entirety.

GRANT STATEMENT

This invention was made with government support under Grant No. DE-EE0009031 awarded by the Department of Energy. The government has certain rights in the invention.

BACKGROUND

Grid-tied photovoltaic (PV) are increasingly being used in distribution power systems due to the high contribution of such systems in power generation to the utility grid. These inverters are rapidly increasing due to the rise of distributed generation (DG) based on renewable energy technologies. As a result of the increase in such typologies, the number of power electronics devices in the electrical grid increase, consequently increasing the sensors in the electrical grid. Since each sensor is considered a vulnerable point for cyber-attacks, it is crucial to facilitate the PV inverters with a cyber-attack detector to defend the inverters against possible cyber-attacks.

SUMMARY

This document describes systems and methods for detecting compromised sensors using dynamic watermarking. In some examples, a method includes injecting a dynamic random signal into an input of a power distribution system. The power distribution system includes at least one sensor and at least one power electronic controller configured to use the at least one sensor. The method includes monitoring a sensor signal from the at least one sensor. The method includes determining whether the at least one sensor is compromised based on a comparison between the dynamic random signal and the sensor signal.

The computer systems described herein can be implemented in software in combination with hardware and/or firmware. For example, the subject matter described herein can be implemented in software executed by a processor. In one example implementation, the subject matter described herein may be implemented using at least one computer readable medium having stored thereon computer executable instructions that when executed by the processor of a computer cause the computer to perform steps or operations. Exemplary computer readable media suitable for implementing the subject matter described herein include non-transitory devices, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

DETAILED DESCRIPTION

Figure 1A:
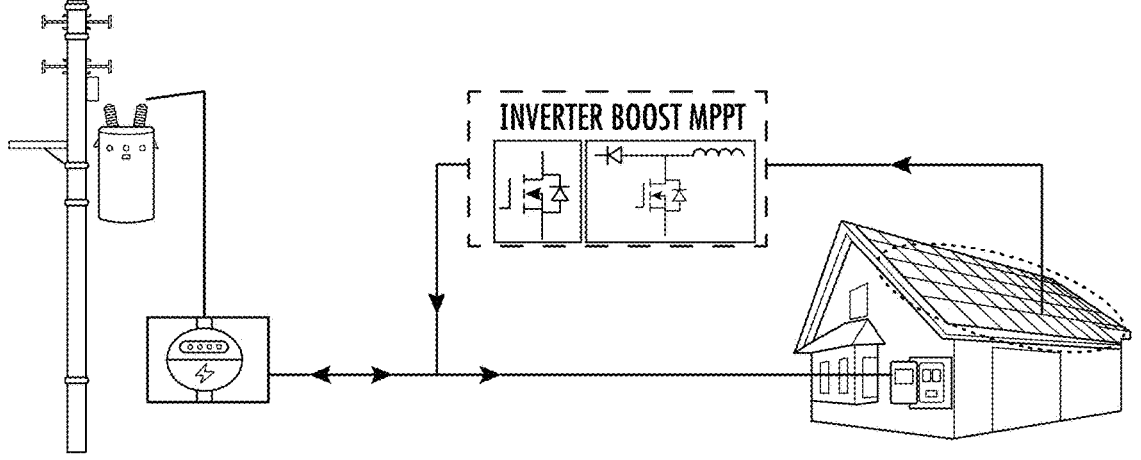
FIGS. 1A-1B show examples of grid-tied photovoltaic systems.

This document describes the development of a "Cyber-shield," a robust cyber intrusion detection scheme employing dynamic watermarking principle. Applications of the "Cybershield" for a grid connected photovoltaic system is first explained. The team has pioneered an active technique in order to detect cyber-attacks on appropriate more general electrical systems described below. Compared with existing passive detection approaches, the dynamic watermarking approach injects a secret signal into the system and can thereby detect a wide class of cyber-attacks with rigorous theoretical guarantee. The basic idea of the approach is as follows: instead of using actual decisions made by the controller, a small, stochastic signal, i.e., the watermark signal, is super-imposed upon the decision from the controller. Such a watermark signal has a certain statistical signature which can be propagated into the measurements. By checking for the existence of the statistical signature appropriately transformed, any potential attacks in a broad class, such as replay attacks and noise injection attacks can be detected. The signature in the measurements can be checked by two dedicated statistical tests.

The watermarking system can be used in any appropriate electrical system to identify compromised sensors, i.e., sensors compromised maliciously or by otherwise failing or degrading. The watermarking system can be used, e.g., on a grid connected photovoltaic system. A private (secret) watermarking signal is superimposed on the control input (modulation signal) of the grid-tied inverter system. This private signal (watermark) propagates through the system and appears in the sensor data. Two statistical tests are used to identify malicious activity on the reported sensors measurements through comparing the actual system's returned sensor signal with one expected based on the system model obtained through system ID algorithms. In the first variance test, the real time measurements is compared against the system model which contains the watermark. The second variance test is similar to the first test except that the system ID model doesn't include the watermarking signal. The two tests together can be used to detect more complex attacks.

In some examples, the watermarking system can be used in systems even though the control inputs are not accessible, e.g., in a commercially available inverter. For example, the watermark can be injected at the DC input terminals where the PV power source is connected, e.g., by a dedicated device located between the PV power source and the inverter. The "Cybershield" employs the injected watermark along with sensor data to compute two statistical tests to successfully detect cyber intrusions in the system.

The dynamic watermarking approach applied for PV system can also be applied to protect and secure thousands of sensor measurement signals widely employed in our nation's critical energy infrastructure (CEI) as well. In a typical CEI and/or a large process facility that handles crude oil/petrochemical plant there are several thousands of process sensors. The data collected from the sensors control complex industrial processes such as in coal/nuclear/natural gas power stations, petrochemical plants, solar/wind energy systems, etc. Potential cyber-attack/intrusion systems can manipulate/corrupt the data and can potentially destabilize systems that are essential and form the backbone our nations CEI. In order to detect cyber intrusions, manipulations of sensor data by external actors, a private random signal (watermark) is injected into the voltage of the electric distribution system. The detection approach in the "Cybershield" includes monitoring various sensor data and performing two statistical tests.

The watermarking signal can be injected in the DC input terminals of a grid connected PV systems and or in a central location in the power distribution system such an input three phase AC power distribution. The watermark signal is expected to propagate throughout the electrical equipment such as transformers, power electronic converters/inverters that control the grid connected systems and critical process controls in an industrial plant. A "Cybershield" device can monitor data collected from many sensors to perform two computational tests to determine if any of the sensors have been compromised due to cyber intrusions or other failures.

Figure 1B:
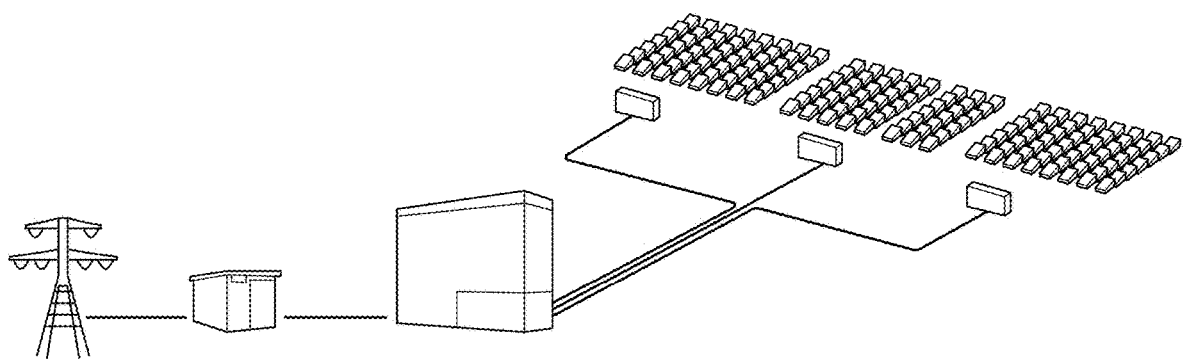

FIGS. 1A-1B show examples of grid-tied photovoltaic (PV) systems. FIG. 1A shows a residential PV system coupled to a meter, an inverter, and a utility grid. FIG. 1B shows a commercial PV production system.

Figure 1C:
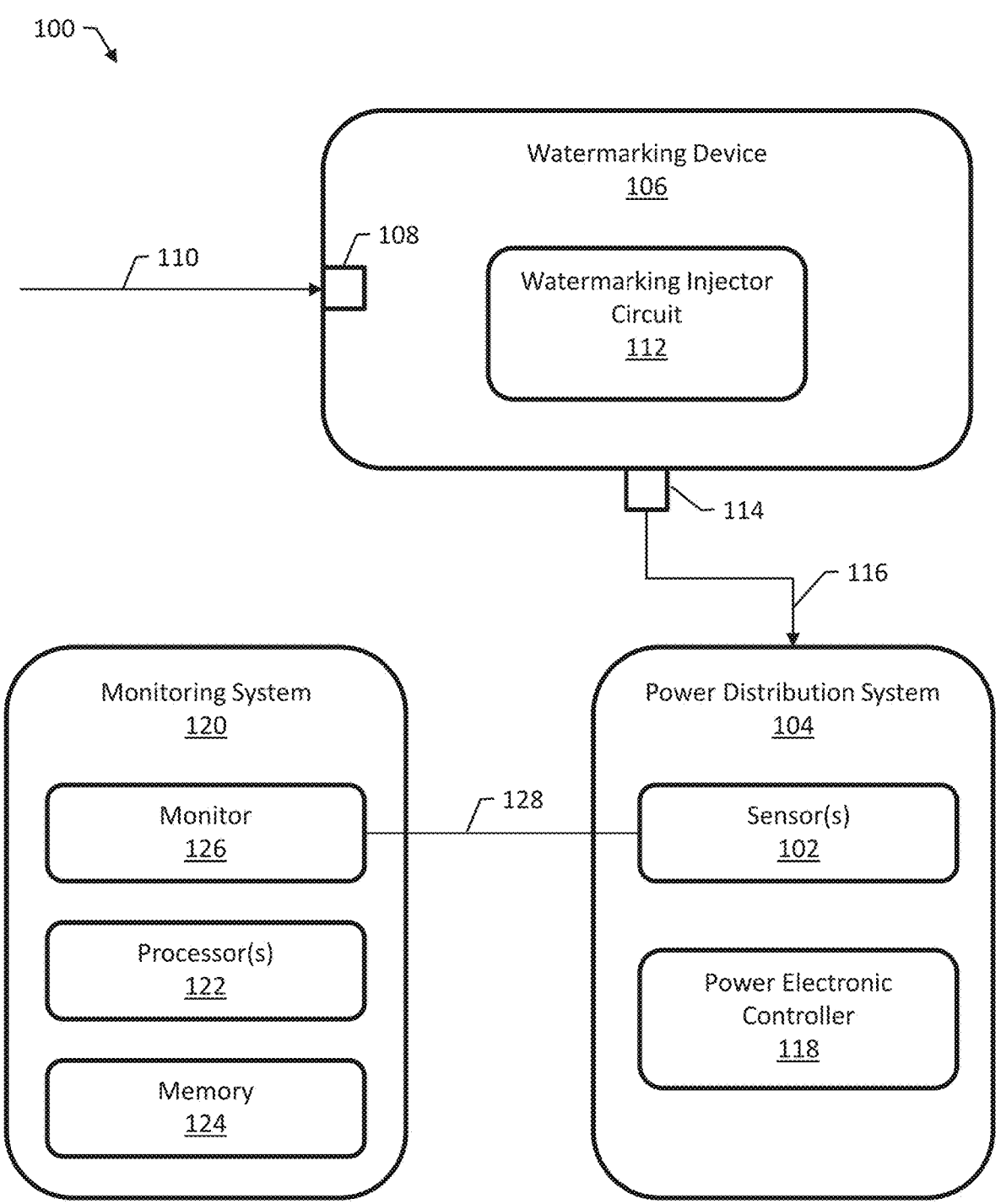
FIG. 1C is a block diagram of an example system for monitoring at least one sensor in a power distribution system.

FIG. 1C is a block diagram of an example system 100 for monitoring at least one sensor 102 in a power distribution system 104. The system 100 includes a watermarking device 106 that includes an input 108 for receiving an electrical signal 110. The watermarking device 106 includes a watermark injector circuit 112 configured for injecting a dynamic random signal into the electrical signal 110. In some examples, the dynamic random signal has a Gaussian distribution with zero mean and an amplitude range sufficiently small such that the dynamic random signal propagates though the power distribution system 104 without disturbing the performance of one or more power conversion stages.

The watermarking device 106 includes an output 114 for outputting the electrical signal 116 with the dynamic random signal superimposed on the electrical signal to the power distribution system 104. The power distribution system 104 includes at least one power electronic controller 118 configured to use the sensor 102.

The system 100 includes a monitoring system 120 that includes at least one processor 122 and memory 124 storing instructions for the processor 122. The monitoring system 120 includes a monitor 126 configured for monitoring at least one sensor signal 128 from the sensor 102. The monitor 126 is configured for determining whether the sensor 122 is compromised based on a comparison between the dynamic random signal and sensor signal 128.

Determining whether the at least one sensor is compromised can include performing two or more variance tests. Performing two or more variance tests can include using moving average sampling. Determining whether the sensor 102 is compromised can include determining that a sequence of measurements from the sensor signal 128 fails at least one variance test by an error amount exceeding a threshold error. Determining whether the sensor 102 is compromised can include detecting if the sensor 102 is malfunctioning and/or the sensor 102 is processing an incorrect signal.

In some examples, the power distribution system 104 is a grid-tied photovoltaic system and the power electronic controller 118 comprises a direct current/alternating current (DC-AC) inverter. In some examples, injecting the dynamic random signal includes injecting the dynamic random signal into an input of the power conversion system 104 by injecting the dynamic random signal into a direct current (DC) input of the inverter. The input can be, e.g., an electrical node between a photovoltaic power source and the inverter. Injecting the dynamic random signal into the input can include injecting the dynamic random signal into a control input of a power conversion device.

Figure 2:
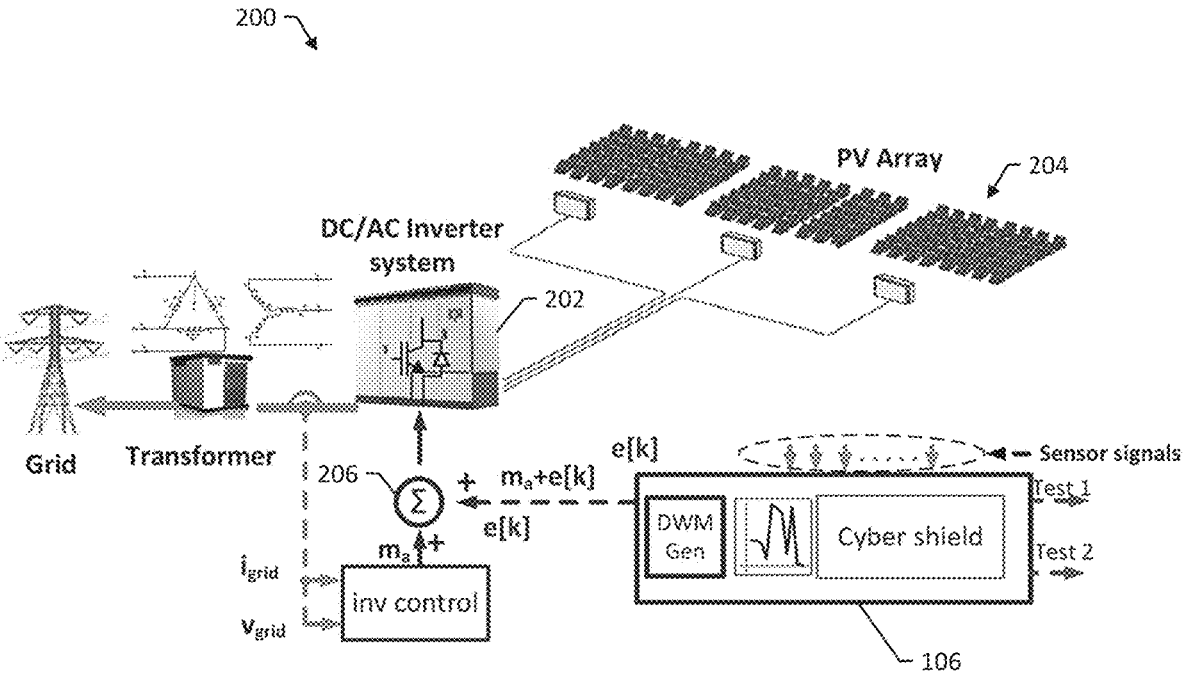
FIG. 2 is a block diagram illustrating an example active detection scheme for cyber-attacks on sensors controlling a grid-tied photovoltaic system.

FIG. 2 is a block diagram illustrating an example active detection system 200 for cyber-attacks on sensors controlling a grid-tied photovoltaic system. The system 200 includes an inverter system 202 coupled to a PV array 204. The system 200 includes a watermarking device 106 that injects a dynamic watermark into an input 206 of the inverter system 202. The input 206 receives a control signal from the inverter control system that has the dynamic watermark superimposed on the control signal.

Figure 3:
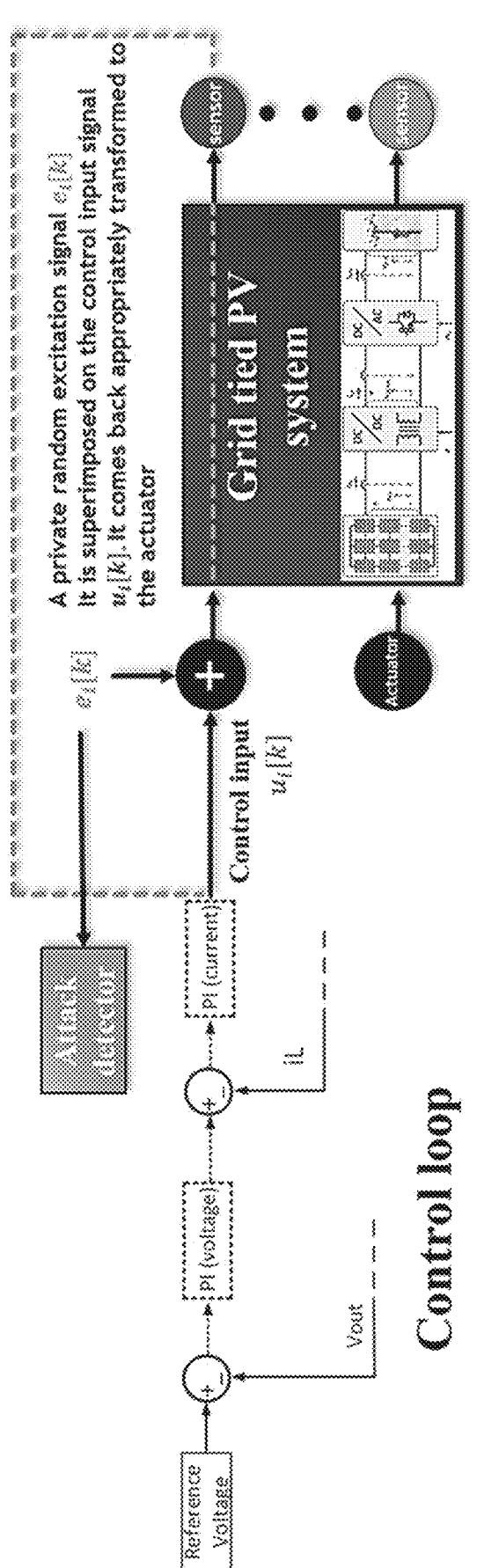
FIG. 3 is a block diagram illustrating a PV system tied to the grid and the dynamic watermarking (DW) signal injection point.

FIG. 3 is a block diagram illustrating a PV system tied to the grid and the dynamic watermarking (DW) signal injection point. The watermarking signal is injected over the control input which is generated from a controller, then the DW signal travels through the whole system including the sensors which sends feedback to the current and vltage controllers to govern the power flow from the PV array to the utility grid.

The DW algorithm includes superimposing a small signal, e[k], smaller than the system's noise, that is truly random and has Gaussian distribution with zero mean on the control input of a converter. The actuator can check if e[k] is properly detected in the system sensor's measurement readings. Two statistical test are developed to validate the sensor's measurements through comparing the actual readings with the system model developed through the transfer functions. If the readings do not agree, the two tests will show a jump in variance indicating a possible attack on the sensor, For the PV system shown in FIGS. 2 and 3, the fundamentals of the DW algorithm revolves around injecting a private signal, that is truly random and unknown to remote observers of the system, onto the control signals of converters, in our case the modulation index, m, of an inverter that controls the inverter stage of the grid-tied inverter system. This small random signal is called "watermarking signal" because it is "indelible" like a watermark on a sheet of paper; it cannot be removed from the sensor measurement.

The essence of the DW algorithm is to inject a random private signal e[k] buried in the inherent noise of the system and travels through all the sensors. This truly random signal with a unique seed only know to the developer is added to the control signal of the system. The "watermarking" name comes from the fact that the signal is always present in the system's signals.

DC-AC Inverter Analysis

Figure 4A:
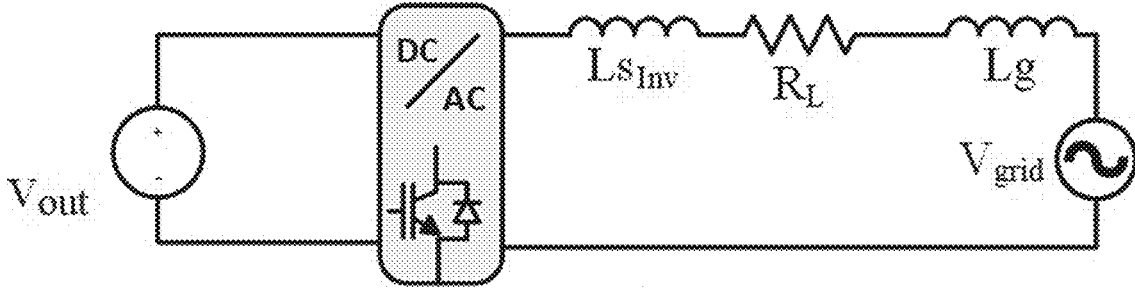
FIGS. 4A-4B demonstrate the grid connected inverter through an inductor.
Figure 4B:
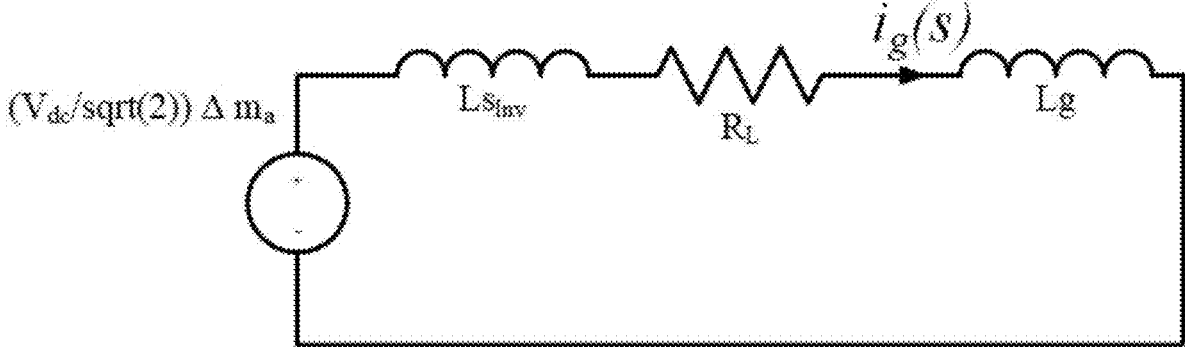

In this section a simplified mathematical model of a DC-AC inverter system is developed between the inverter output current and the control signal. FIGS. 4A-4B demonstrate the grid connected inverter through an inductor Ls. The short circuit impedance and the line resistance is represented. FIG. 4A shows the grid tied inverter and FIG. 4B shows the small signal circuit equivalent.

Equation (2) represents the transfer function of the system.

$$\frac{i_{grid}(s)}{\Delta m_a(s)} = \frac{\dfrac{V_{dc}}{\sqrt{2}}}{(L_s + L_g)\left(s + \dfrac{R}{L_s + L_g}\right)} \tag{1}$$

To simplify equation (1) we define, $$\beta_1 = \frac{V_{dc}}{\sqrt{2}\,(L_s + L_g)} \quad \beta_2 = \frac{R}{L_s + L_g} \tag{25}$$

Equation (1) can now be rewritten as, $$\frac{i_g(s)}{m_a(s)} = \frac{\beta_1}{s + \beta_2} \tag{2}$$

Equation (3) represents the continuous differential equation which corresponds to equation (1).

$$\dot{i}_g(t) = -\beta_2 i_g(t) + \beta_1 m_a(t) \tag{3}$$

To convert this equation to a discrete system, we use Tusten method, with the knowledge of the sample time $\Delta t$ $$i_g[k+1] = \beta_2' i_g[k] + \beta_1' m_a[k] \tag{4}$$

where $\beta_1'$ and $\beta_2'$ are obtained by the Tustin method based on original system parameters.

The DW signal e[k] is superimposed on the control signals of the plant, and the addition of the DW signal to the control signal, i.e., modulation signal $m_a[k]$, we denote the new modulation index signal by $m_{a(WM)}[k]$ as shown in (5)

$$m_{a(WM)}[k] = m_a[k] + e[k] \tag{5}$$

Now substituting (5) in (4) we acquire $i_{g(WM)}[k+1]$ which includes the DW as, $$i_g(WM)[k+1] = \beta_2 i_g[k] + \beta_1 m_a(WM)[k] \tag{6}$$

Simplifying (6) we obtain, $$i_{g(WM)}[k+1] = \beta_2 i_g[k] + \beta_1 (m_a[k] + e[k]) \tag{7}$$

Assume the actual grid current of the DC-AC inverter obtained from a smart meter or a sensor is z[k] and a system model is developed to generate a replicated signals, ig[k], that are always healthy. For a system operating in normal conditions, the current sensor signal is $z[k] \equiv i_g[k]$. Should the grid current sensor be compromised $z[k] \neq i_g[k]$. Two statistical tests are designed to validate the sensed signals and alert in cases of an attack.

Variance Test 1 for the Grid-tied Inverter:

Considering equation (7), $i_{g(WM)}[k+1]$ represents the system model output, in this case the grid current, including DW signal. z[k+1] represents the actual sensor measurement of the plant. Variance test 1 is given by, $$\lim_{K \to \infty} \frac{1}{K} \sum_{k=0}^{K-1} (z[k+1] - i_{g(WM)}[k+1])^2 = \sigma_\omega^2 \tag{8}$$

This method uses moving average sampling and equation (8) is calculated continuously for a set number of samples predefined by the algorithm. In the instances where the actual system's signals and the model's measurements are the same, variance test 1 will only show the system's noise, $\sigma_\omega^2$, and the algorithm concludes that the plant is healthy i.e. no attack is occurring. If the measured signals of the model and the plant do not match, z[k+1] and ig(WM)[k+1] are not equal then the variance test will show a jump indicating the possibility of a cyber attack targeting the plant's sensor is taking place.

Variance Test 2 for the Grid-tied Inverter:

Variance Test 2 is essentially the difference between the actual grid current measurement, z[k+1] and $i_g[k+1]$ obtained from the model and is given by, $$\lim_{K \to \infty} \frac{1}{K} \sum_{k=0}^{K-1} (z[k+1] - i_g[k+1])^2 = \sigma_\omega^2 + (\beta_1)^2 \sigma_e^2 \tag{9}$$

The actual current measurement from the plant in equation $z_1[k+1]$(9) is and the $i_g[k+1]$ is the output current calculated from the system model shown in equation (4) which does not include the DW signal. Similar to test 1, if the actual system's signals and the model's measurements are the same, the output of equation (9) will show the system's noise, $\sigma_\omega^2$, and DW signal variance $\sigma_e^2$. Otherwise, if the test will show a jump indicating the possibility of an attack occurring on the system. If an attacker disconnects the actual signal fed to the controller by his signal obtained from a simulated model, the attacker's signal won't include the DW signal.

Since the testing algorithm looks for the traces of the DW signal in the measurements, it will signal for an attack.

Example Test Results

Several cyber attack scenarios were tested on a laboratory prototype grid-tied inverter system (Table 1 shows the specifications).

TABLE I

| Grid-tied PV system design parameters | | |
| --- | --- | --- |
| Parameter | | Magnitude |
| Rated Power | 5 kW | 0.5 pu |
| DC link voltage | 200 v | |
| Switching frequency | 15 kHz | |
| Grid voltage | 120 v rms | |
| Grid impedance $L_{grid}$, $R_{grid}$ | | |

Figure 5:
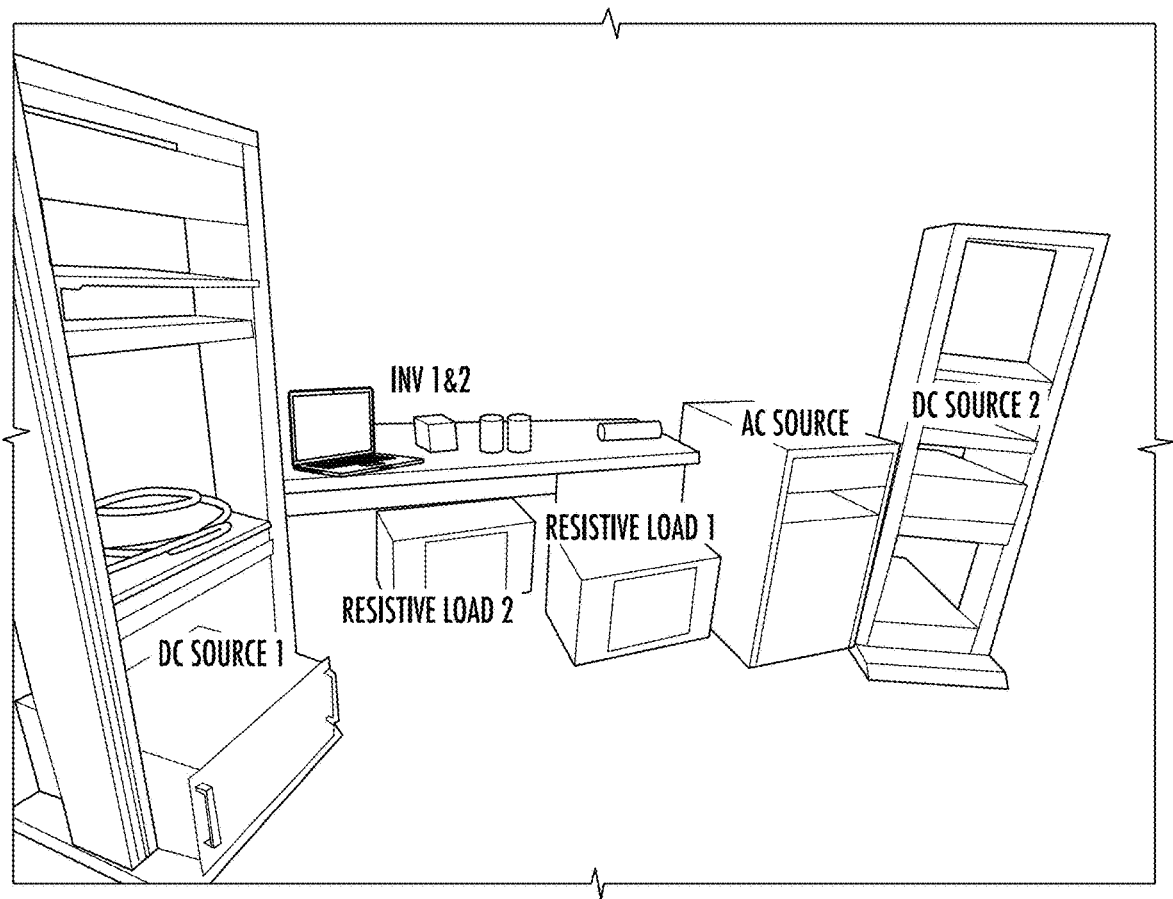
FIG. 5 shows the experimental setup of the grid tied inverter systems.

FIG. 5 shows the experimental setup of the grid tied inverter systems. Two attack scenarios are detailed a) Harmonic injection attack and b) Replay attack.

Harmonic Injection Attack

Figure 6:
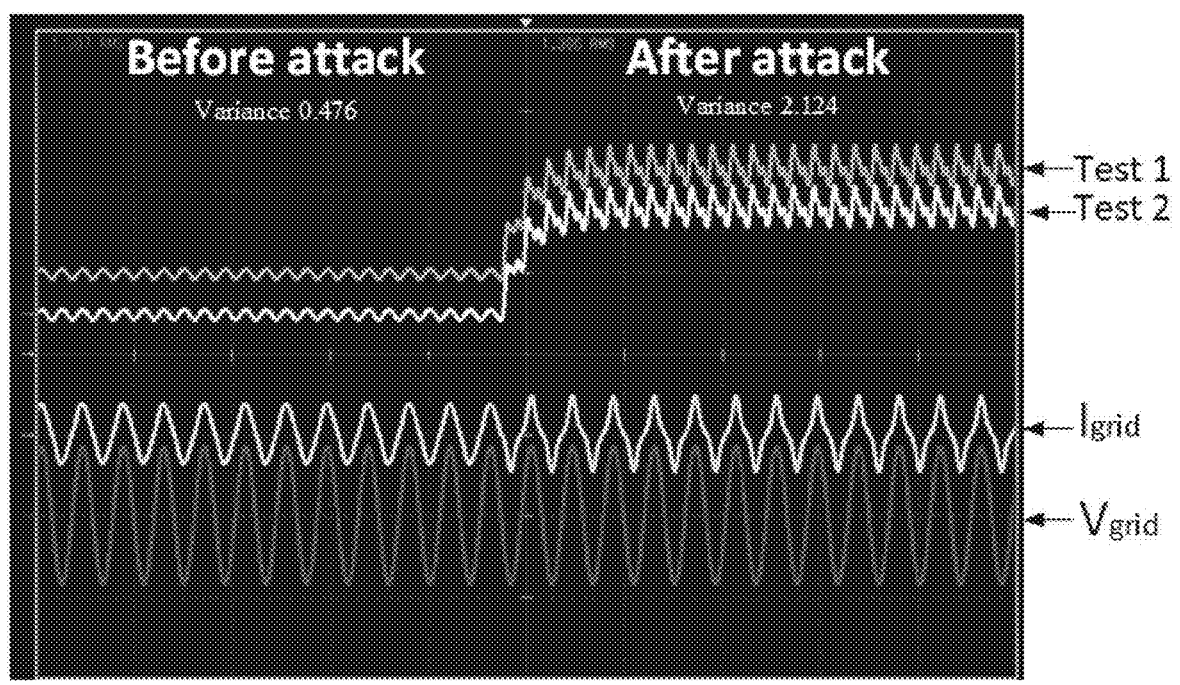
FIG. 6 shows the laboratory test results of the harmonics injection attack.

FIG. 6 shows the laboratory test results of the harmonics injection attack. It can be seen that after the attack starts, 3rd and 5th harmonics were injected into the current sensor.

The variance tests 1 and 2 shows a jump indicating malicious activity (attack) on the current sensor. The attack is detected almost instantaneously, less than a cycle (16 ms). It can also be seen that the attack resulted in distorting the current fed to the grid (FIG. 6). In the event the injected harmonics were larger in magnitude the grid-tied inverter system could have tripped and/or caused voltage distortion at the point of common coupling.

Replay Attack

In this attack a healthy signal is recorded at a previous time during the normal operation of the system. This signal is then replayed instead of the current sensor signal to show that the system is performing normally regardless of what happens in real time. This type of attack has been recorded before in the well known incident "Stuxnet". The digital watermarking signal is able to detect such a complex attack due to the randomness of the signal. The watermarking signal propagates through the whole system continuously.

Figure 7:
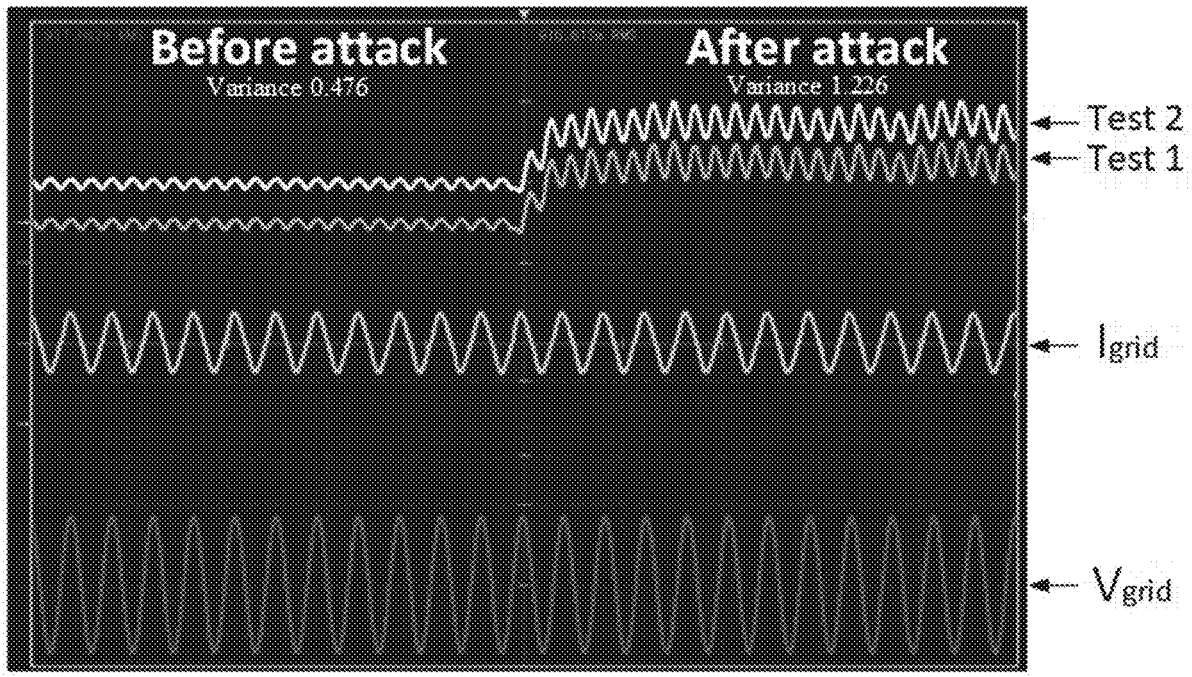
FIG. 7 shows a replay attack conducted on the Grid tied inverter prototype.

Since the attacker will show a replayed signal recorded in the past or obtained from an accurate simulation model, the watermarking signal that is present in the recorded signal will be different than the signal present in the system model which we are comparing against in variance tests 1 and 2. This difference in watermarking signal signature is detected by the algorithm as an anomaly in the system and as a result the attack can be identified. FIG. 7 shows a replay attack conducted on the Grid tied inverter prototype. In this attack a healthy signal was recorded and replayed. The algorithm detects the attack as the variances jump signaling an attack on the sensor.

Figure 8:
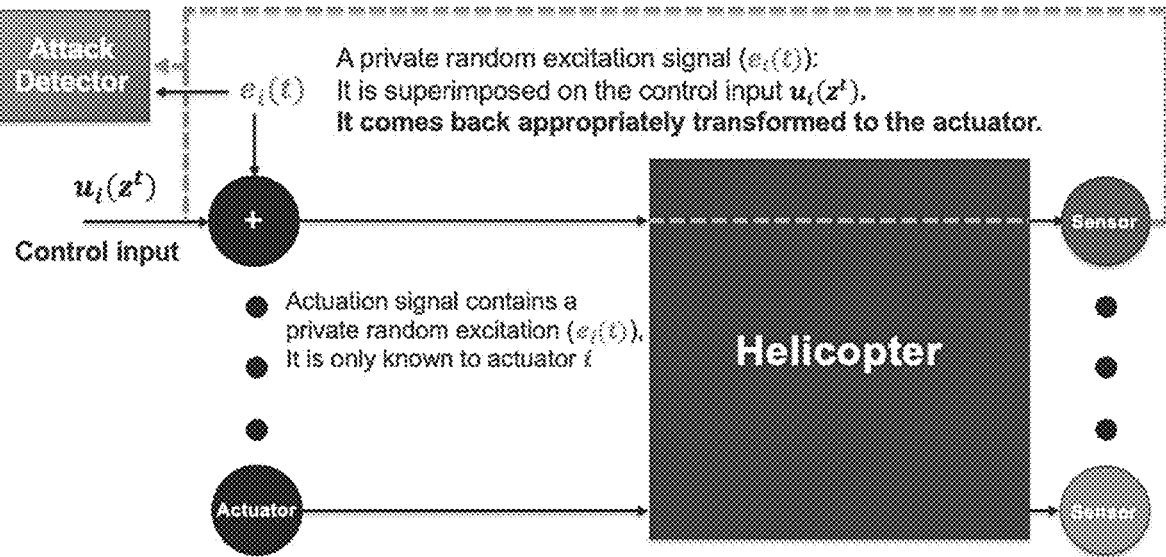
FIG. 8 is a block diagram of a security system for an unmanned aerial vehicle flight control system.

FIG. 8 is a block diagram of a security system for an unmanned aerial vehicle flight control system. To provide a concrete setting, we consider the security problem in the context of a helicopter which is compromised by a malicious agent that distorts elevation measurements to the control loop. This is a particular example of the problem of the security of stochastic control systems under erroneous observation measurements caused by malicious sensors within the system.

In order to secure the control system, we consider dynamic watermarking, where a private random excitation signal is superimposed onto the control input of the flight control system. An attack detector at the actuator can then check if the reported sensor measurements are appropriately correlated with the private random excitation signal. This is done via two specific statistical tests whose violation signifies an attack.

Figure 9:
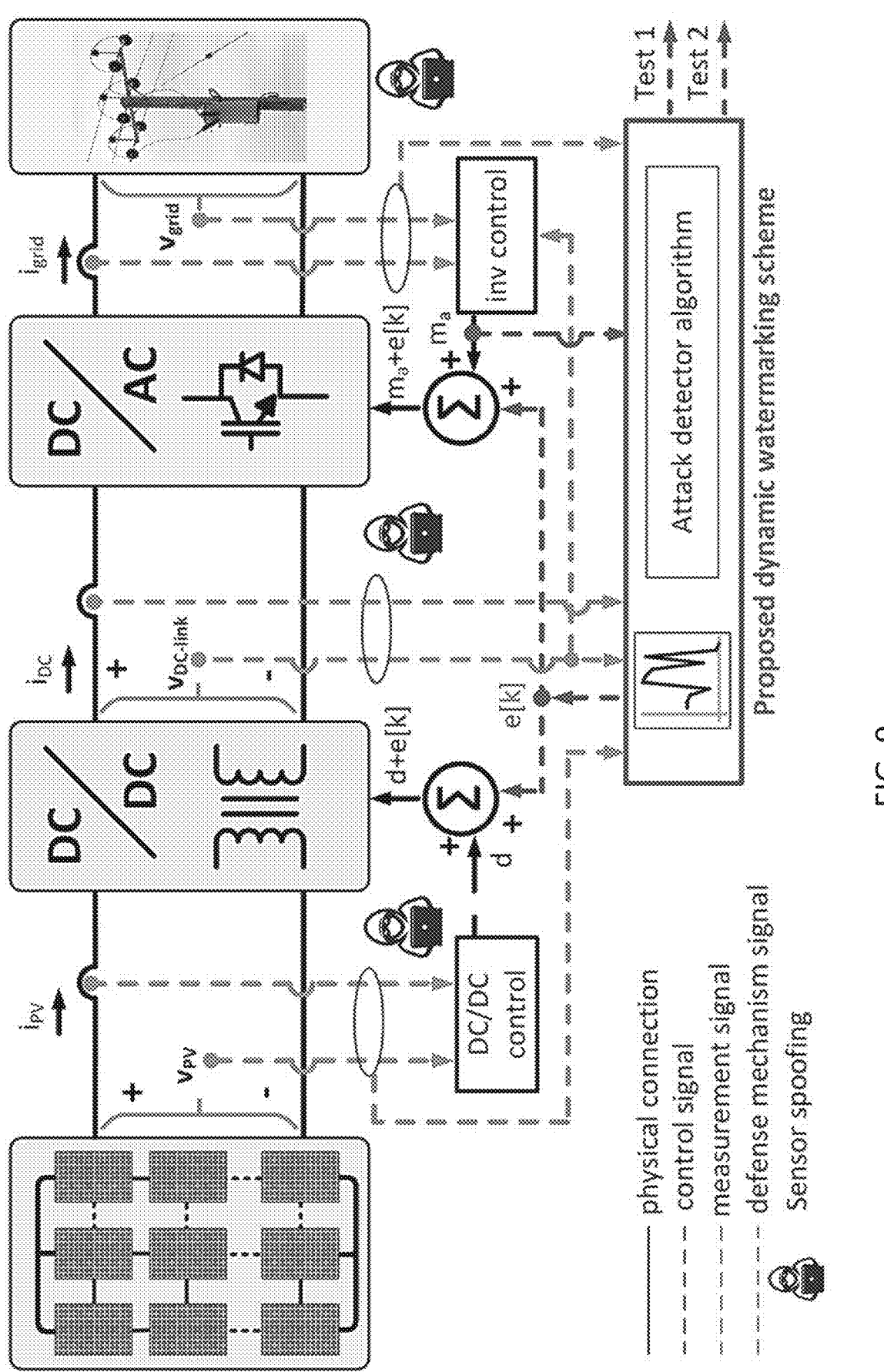
FIG. 9 is a block diagram of an example grid tied PVT system showing possible sensor spoofing (manipulation) by an external attacker.

FIG. 9 is a block diagram of an example grid tied PVT system showing possible sensor spoofing (manipulation) by an external attacker. FIG. 9 shows a detailed schematic along with sensor measurements required for the control of the DC-DC and DC-AC conversion stages in the system. The DC output from the PV panels are interfaced to a DC-DC boost converter that is controlled in closed loop to regulate the output (DC) voltage and simultaneously enable maximum power point tracking (MPPT). The DC-DC boost stage is followed by a pulse width modulated (PWM) DC-AC inverter, output filter and is connected to the utility grid. The output of the MPPT stage forms the available power input command to the DC-AC inverter stage. The current and voltage sensors regulate the power flow from the PV to utility grid.

The example DWS system operates by injecting (superimposing) a private (secret) random excitation signal $e[k]$ that has a Gaussian distribution on the signal that controls the switch duty cycle "d" of the DC-DC converter stage and the modulation index "$m_a$" on the DC-AC inverter stage that controls the switch on/off states. The magnitude of the random excitation signal $e[k]$ is small and does not affect the performance of the system. However, the watermark signal $e[k]$ propagates through the power conversion stages and manifests in the voltage/current signals that are sensed. Should any of the sensors that control the power conversion stages be compromised (spoofed and/or altered by the attacker), a series of statistical tests are used to check whether each of reported sensor measurement readings are compatible with the injected (superimposed) watermark to determine any malicious tampering.

Figure 10:
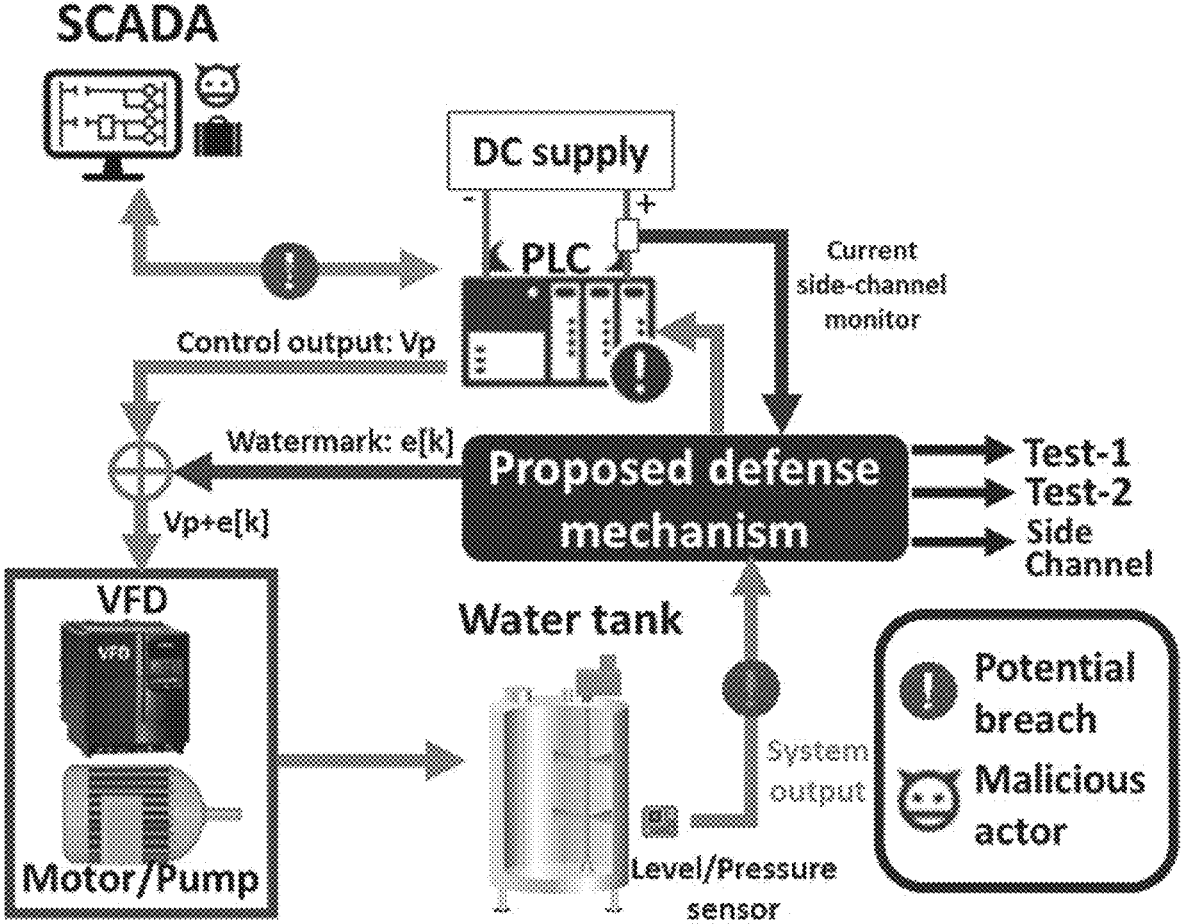
FIG. 10 is a block diagram of an example industrial control system (ICS) with an example defense mechanism to protect programmable logic circuit (PLC)-based infrastructure.

FIG. 10 is a block diagram of an example industrial control system (ICS) with an example defense mechanism to protect programmable logic circuit (PLC)-based infrastructure. The defense mechanism can include the addition of a unique digital watermark to the pulse-width modulation (PWM) control that adjusts the motor speed to control the critical process. This enables efficient detection and identification of any unauthorized modifications to the sensor signals responsible for controlling the plant.

As shown in the example of FIG. 10, the PLC is tasked/programmed with closed loop control functions (such as PI/PID) to adjust the variable frequency drive (VFD) speed to adjust the flow rate to control the water tank level. A pressure sensor in the water tank-1 translates the water level via a sensor signal that is then fed back to the PLC.

During normal operation, the closed loop system functions appropriately by adjusting the VFD motor/pump to regulate the water tank level-1. The defense mechanism operates by adding a unique small magnitude digital watermarking signal (a random variable with a gaussian distribution and zero mean average) to the control signal to adjust the VFD speed. The watermark signal then propagates through the VFD/Motor/Pump and its signature is reflected on the water tank level sensed by the pressure sensor. Two variance tests are then conducted continuously to realize a defensive mechanism by observing the signals' presence and validate its signature by comparing it to the system model. A high value in the variance computed in Test-1 and Test-2 is shown to indicate the presence of false date in the water tank level information (i.e., the pressure sensor data has been manipulated).

It will be understood that various details of the presently disclosed subject matter can be changed without departing from the scope of the presently disclosed subject matter. Furthermore, the foregoing description is for the purpose of illustration only, and not for the purpose of limitation.

The control systems and computer systems described herein may be implemented in hardware, software, firmware, or any combination thereof. In some exemplary implementations, the subject matter described herein may be implemented using a computer readable medium having stored thereon computer executable instructions that when executed by the processor of a computer control the computer to perform steps.

Exemplary computer readable media suitable for implementing the subject matter described herein include non-transitory computer readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

What is claimed is:

1. A method comprising:

injecting a dynamic random watermarking signal into an input of a power distribution system, the power distribution system comprising at least one sensor and at least one power electronic controller configured to use the at least one sensor;

monitoring sensor signal from the at least one sensor; and determining whether the at least one sensor is compromised by sampling real time measurements from the sensor signal, sampling real time measurements from a system model that includes the dynamic random watermarking signal, computing a statistical variance between the real time measurements from the model that includes the dynamic random watermarking signal and the real time measurements from the sensor signal, detecting an increase in the statistical variance, and, in response to detecting the increase in the statistical variance, indicating the presence of a possible attack on the at least one sensor.

2. The method of claim 1 wherein the power distribution system is a grid-tied photovoltaic system and the at least one power electronic controller comprises a direct current/alternating current (DC-AC) inverter.

3. The method of claim 2 wherein injecting the dynamic random watermarking signal into the input comprises injecting the dynamic random watermarking signal into a direct current (DC) input of the inverter.

4. The method of claim 2 wherein the input is an electrical node between a photovoltaic power source and the inverter.

5. The method of claim 1 wherein injecting the dynamic random watermarking signal into the input comprises injecting the dynamic random watermarking signal into a control input of a power conversion device.

6. The method of claim 1 wherein the dynamic random watermarking signal has a Gaussian distribution with zero mean and an amplitude range sufficiently small such that the dynamic random watermarking signal propagates though the power distribution system without disturbing the performance of one or more power conversion stages.

7. The method of claim 1 wherein determining whether the at least one sensor is compromised comprises performing two or more variance tests.

8. The method of claim 6 wherein performing two or more variance tests comprises using moving average sampling.

9. The method of claim 1 wherein determining whether the at least one sensor is compromised comprises determining that a sequence of measurements from the sensor signal fails at least one variance test by an error amount exceeding a threshold error.

10. The method of claim 1 wherein determining whether the at least one sensor is compromised comprises detecting if the at least one sensor is malfunctioning and/or the at least one sensor is processing an incorrect signal.

11. A system comprising:

a watermarking device comprising:

an input for receiving an electrical signal;

a watermark injector circuit configured for injecting a dynamic random watermarking signal into the electrical signal; and an output for outputting the electrical signal with the dynamic random signal superimposed on the electrical signal to a power distribution system, the power distribution system comprising at least one sensor and at least one power electronic controller configured to use the at least one sensor; and a monitoring system, implemented on at least one processor, configured for monitoring a sensor signal from the at least one sensor and determining whether the at least one sensor is compromised by sampling real time measurements from the sensor signal, sampling real time measurements from a system model that includes the dynamic random watermarking signal, computing a statistical variance between the real time measurements from the model that includes the dynamic random watermarking signal and the real time measurements from the sensor signal, detecting an increase in the statistical variance, and, in response to detecting the increase in the statistical variance, indicating the presence of a possible attack on the at least one sensor.

12. The system of claim 11, wherein the power distribution system is a grid-tied photovoltaic system and the at least one power electronic controller comprises a direct current/alternating current (DC-AC) inverter.

13. The system of claim 12, wherein injecting the dynamic random signal into the input comprises injecting the dynamic random signal into a direct current (DC) input of the inverter.

14. The system of claim 12, wherein the input is an electrical node between a photovoltaic power source and the inverter.

15. The system of claim 11, wherein injecting the dynamic random watermarking signal into an input comprises injecting the dynamic random watermarking signal into a control input of a power conversion device.

16. The system of claim 11, wherein the dynamic random watermarking signal has a Gaussian distribution with zero mean and an amplitude range sufficiently small such that the dynamic random watermarking signal propagates though the power distribution system without disturbing the performance of one or more power conversion stages.

17. The system of claim 11, wherein determining whether the at least one sensor is compromised comprises performing two or more variance tests.

18. The system of claim 16, wherein performing two or more variance tests comprises using moving average sampling.

19. The system of claim 11, wherein determining whether the at least one sensor is compromised comprises determining that a sequence of measurements from the sensor signal fails at least one variance test by an error amount exceeding a threshold error.

20. The system of claim 11, wherein determining whether the at least one sensor is compromised comprises detecting if the at least one sensor is malfunctioning and/or the at least one sensor is processing an incorrect signal.

* * * * *